(12) United States Patent
Nagaishi et al.

(10) Patent No.: US 6,747,488 B2
(45) Date of Patent: Jun. 8, 2004

(54) MULTIPLE PLL OSCILLATOR AND MULTIPLE CW RADAR USED THEREFORE

(75) Inventors: Hideyuki Nagaishi, Hachioji (JP); Naoyuki Kurita, Kokubunji (JP); Toshiyuki Nagasaku, Kokubunji (JP); Kazuhiro Nagaoka, Hachioji (JP); Hiroshi Kondoh, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/222,829

(22) Filed: Aug. 19, 2002

(65) Prior Publication Data

US 2004/0012447 A1 Jan. 22, 2004

(30) Foreign Application Priority Data

Jul. 16, 2002 (JP) .................................... 2002-206718

(51) Int. Cl.[7] ..................... H04L 27/20; H03B 1/04
(52) U.S. Cl. ................. 327/113; 375/308; 455/112
(58) Field of Search .................... 327/105, 113, 327/106, 156, 115; 455/112, 113, 118; 375/307, 308

(56) References Cited

U.S. PATENT DOCUMENTS 6,115,586 A    9/2000  Bezzam et al. ............. 455/112
6,356,597 B1 *  3/2002  Jackson et al. ............. 375/308

FOREIGN PATENT DOCUMENTS

| FR | 2 738 420 | | 1/1980 |
| GB | 2 098 419 A | | 5/1981 |
| JP | 360032431 | * | 2/1985 |
| JP | 404129067 | * | 4/1992 |
| JP | 09-064734 | | 8/1995 |

* cited by examiner

Primary Examiner—Dinh T. Le
(74) Attorney, Agent, or Firm—Reed Smith LLP; Stanley P. Fisher, Esq.; Juan Carlos A. Marquez, Esq.

(57) ABSTRACT

A multiple PLL oscillator for oscillating and outputting a plurality of frequencies having a predetermined step frequency, comprising a first and a second reference frequency sources, a switch for selecting the ore of outputs of the first and the second reference frequency sources alternatively and at predetermined time interval, and a PLL frequency synthesizer generating a millimeter wave oscillation output corresponding to each of the first and second reference frequency sources.

8 Claims, 11 Drawing Sheets

PRIOR ART

FIG. 12

PRIOR ART

MULTIPLE PLL OSCILLATOR AND MULTIPLE CW RADAR USED THEREFORE

BACKGROUND OF THE INVENTION

1. Field of the Invention

The present invention relates to a multiple PLL oscillator and, more particularly, to a multiple PLL oscillator suitable as an oscillator requiring both a higher transmitting frequency and reduction of phase noise in a radar performing a scan in a multiple millimeter CW radar.

2. Description of the Related Art

Figure 11:
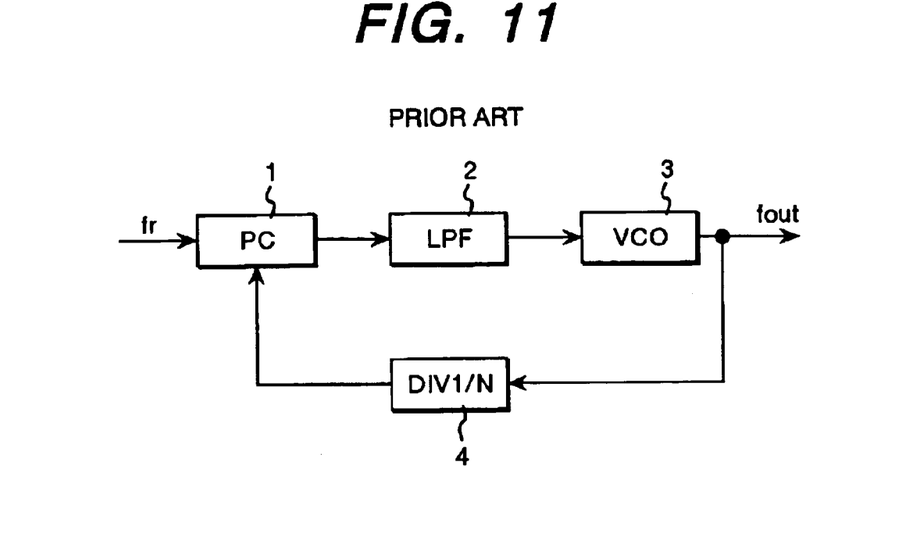
FIG. 11 is a block diagram showing the principle configuration of the PLL oscillator.

The principle configuration of a PLL oscillator is, as shown in FIG. 11, that the phase of a signal of a reference frequency fr and the phase of an output signal of a frequency divider 4 as a loop feedback signal are compared with each other by a phase comparator 1, the result is integrated and converted to a voltage signal by a low pass filter 2, and a voltage controlled oscillator 3 is controlled by the voltage signal. A part of an output of the voltage controlled oscillator 3 is divided by the frequency divider 4 to 1/N, the resultant is supplied as a signal to be compared to the phase comparator 1. The frequency-divided output frequency is compared with the reference frequency fr, thereby obtaining a PLL oscillator output of a desired frequency fout (=fr×N). A multiple PLL oscillator obtaining a number of oscillation frequency outputs by changing the dividing number N of frequency is constructed.

From viewpoints of making the device simpler, making the band of an operation frequency wider, shortening time required for an oscillation frequency of a PLL circuit to reach a desired frequency (lock-up time), and the like in the actual configuration of a PLL oscillator, various PLL oscillators have been proposed.

Figure 12:
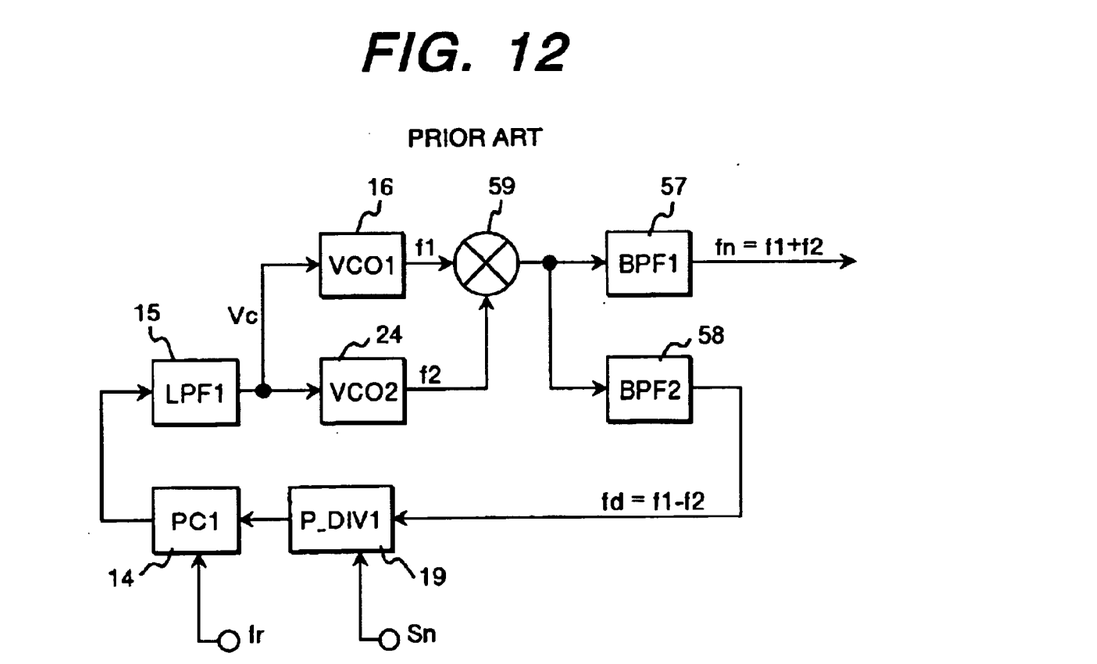
FIG. 12 is a block diagram showing the configuration of a known PLL oscillator.

Particularly, as a PLL oscillator adapted for use in telephones such as a mobile telephone and a portable telephone, a radio receiver, and a transceiver, having a relatively simple circuit configuration, realizing an oscillation output which is a high frequency, simultaneously, capable of varying an output frequency with short lock-up time and narrow frequency interval (frequency step), a PLL circuit as shown in FIG. 12 has been proposed (Japanese Unexamined Patent Application No. Hei-9-64734).

In the PLL circuit shown in FIG. 12, an oscillation output (oscillation frequency f1) of a first variable frequency oscillating circuit 16 and an oscillation output of a second variable frequency oscillating circuit 24 having an oscillation frequency f2 lower than that of the variable frequency oscillating circuit 16 are mixed by a mixer 59. A signal indicative of a sum of the oscillation frequencies of the variable frequency oscillating circuits 16 and 24 and a signal indicative of a difference between the oscillation frequencies are supplied as an oscillation output signal of the PLL circuit and an input signal of a feedback loop via filters 57 and 58. The feedback loop has a frequency divider 19 for dividing an oscillation signal of the frequency the difference. The phase of an output signal of the frequency divider 19 is compared with that of the signal of the reference frequency fr by a phase comparator 14. An output of the phase comparator 14 controls the oscillation frequencies of the variable frequency oscillating circuits 16 and 24 via a low pass filter 18.

The oscillation frequency of each of the variable frequency oscillating circuits 16 and 24 can be about the half of an output oscillation frequency fn of the PLL circuit, and the dividing number of the frequency divider can be reduced by feeding back an oscillation frequency difference fd between the variable frequency oscillating circuits 16 and 24 to the frequency divider 19 and mixing down a feedback signal of the loop to a lower frequency. Consequently, the lock-up time can be shortened and, simultaneously, the oscillation output can be changed at low frequency intervals also in a high frequency band.

In the PLL oscillating circuit shown in FIG. 12, a problem which occurs in a use where the circuit operates at the frequency interval of tens to hundreds kHz of the oscillation frequency in the millimeter wave band is not considered. For example, in a two frequency CW radar using millimeter waves which operates in a millimeter wave band, the frequency is switched at predetermined time intervals, and a distance and relative speed to an obstacle are detected on the basis of a Doppler shift and a phase difference of two received waves. Consequently, a reflected wave observed during a period in which an output frequency of a multiple PLL circuit is unstable due to increase in the lock-up time is handled as an indeterminate signal. The S/N ratio (=the signal of the radar−noise level) deteriorates by an amount corresponding to decrease in the total energy of the reflected wave. The more the frequency step is narrowed, the more the lock-up time increases, so that the two frequency CW radar using millimeter waves does not function at worst. In the case where the time of switching the frequency is increased so as to sufficiently observe the reflected wave, the frequency upper limit at the time of FFT (Fourier transform) in an A/D sampling period is suppressed, and an obstacle which moves at high speed cannot be detected.

In the proposed PLL circuit, the reference frequency is equal to or proportional to the frequency interval (frequency step) of the oscillation output. Therefore, the narrower the frequency interval is set, the narrower the loop band of the PLL becomes, so that the lock-up time to reach the desired frequency increases. In the case where a step frequency is hundreds kHz, the loop band of the PLL circuit is a faction of the frequency step so that the reference frequency component does not directly propagate to a voltage controlled oscillator, and lock-up time inversely proportional to the loop band is about tens $\mu$sec.

In the PLL circuit shown in FIG. 12, the voltage controlled oscillating circuits 16 and 24 are disposed in parallel in a single PLL loop, and the oscillation frequency difference between the oscillating circuits computed by the mixer 59 is supplied as a loop feedback signal of the PLL circuit to the frequency divider 19. By increase in a loop gain K by reduction in the dividing number of frequency and shortened logic delay time of the frequency divider, the lock-up time is shortened.

Particularly, the PLL circuit is constructed by using the single reference frequency fr, and the output oscillation frequency fn of the PLL oscillating circuit is determined only by the reference frequency fr and the dividing number N of frequency of the frequency divider. Therefore, in the case of using the PLL circuit for a two waves millimeter wave radar of a millimeter wave band oscillation frequency and a step frequency of hundreds kHz, the dividing number of frequency becomes an enormous figure, so that it is impossible to main stability of the PLL circuit and shorten the lock-up time.

Since flicker caused by heat and external factors in the oscillating circuits 16 and 24 is absorbed as oscillation frequency variations in the PLL loop, an oscillation output in which the flicker is added and multiplied is observed.

When two voltage controlled oscillators are constructed in the PLL loop, it is estimated that the state is similar to a state where a single feedback system has a plurality of oscillators, an oscillation like a double pendulum movement occurs, and the lock-up time becomes longer than lock-up time calculated from a loop band and a loop gain.

Further, since ratios of change of the oscillation frequencies f1 and f2 with respect to a control voltage Vc of the two voltage controlled oscillating circuits 16 and 24 are different from each other, to realize the PLL oscillating circuit, the ratios of change of the voltage controlled oscillating circuits 16 and 24 with respect to the control voltage Vc have to be constant and the frequency difference has to increase monotonously. Since the PLL loop performs a feedback control only on the frequency difference, even when the PLL operation is normally performed in the PLL loop, the frequency step of the oscillation frequency is not always correct. Generally, a voltage controlled oscillating circuit controls a depletion-layer capacitance of a structure of a semiconductor diode to specify the oscillation frequency. In an oscillating circuit in a millimeter wave band, in consideration of existence of stray capacitance, heat, and external factors which cannot be expressed in numerical values, it is difficult to make the change ratio difference between the oscillation frequency and the control voltage increase monotonously.

Since main targets of the PLL oscillating circuit of FIG. 12 are telephones such as a mobile telephone and a portable telephone, radio receivers, and transceivers, there is a tendency that the dividing number of frequency is increased to widen the variable range of the oscillation frequency. Consequently, the logic delay time in the frequency divider in the PLL loop is long, and it is also a factor of increasing the lock-up time.

SUMMARY OF THE INVENTION

An object of the invention is therefore to realize a multiple PLL oscillator having an oscillation output in a millimeter wave band and a simple configuration, with shortened lock-up time realized by decreasing the dividing number of frequency of a frequency divider provided for a PLL loop.

Another object of the invention is to realize a multiple millimeter CW radar for a vehicle, using a signal in a millimeter band, using a signal for generating signals of a plurality of frequencies having a relatively small transmission frequency difference (step frequency) at a predetermined interval, economically constructed, and operating stably.

To achieve the object, a multiple PLL oscillator of the invention includes: a plurality of reference frequency sources; a switch for selecting one of outputs of the plurality of reference frequency sources; a feedback loop circuit; a phase comparator for comparing the phase of a signal of a reference frequency selected by the switch with that of a signal from the feedback loop circuit; a voltage controlled oscillator controlled by an output of the phase comparator; a mixer for mixing an output of the voltage controlled oscillator with an output signal of a locked reference frequency source of another locked frequency; and an output unit for outputting an upper side band frequency of the mixer as an output. The feedback loop circuit has a frequency divider for receiving a lower side band frequency of the mixer and dividing the frequency of the input signal.

The multiple PLL oscillator of the invention includes: a plurality of reference frequency sources; a switch for selecting one of outputs of the plurality of reference frequency sources to thereby obtain a signal of a reference frequency; and a frequency synthesizer for setting a signal selected by the switch as a reference frequency. The frequency synthesizer is constructed to generate an oscillation output of the frequency corresponding to each of the plurality of reference frequency sources.

In the multiple PLL oscillator according to the invention, a plurality of output frequencies in the millimeter wave band having a frequency step are switched and output in a short period, and the frequency step is realized by switching operation of the switch for the plurality of reference frequency sources irrespective of a frequency divider. The frequency difference of the reference frequency sources is used, and signals indicative of sum and different of frequencies obtained by the mixer are used as an output signal of the multiple PLL oscillator and a loop feedback signal of the PLL loop, respectively, so that the dividing number of frequency of the frequency divider is decreased, and widening of the loop band, increase in the loop gain, and shortening of the lock-up time of the PLL circuit can be realized. Specifically, the lock-up time of the PLL circuit is proportional to a damping factor $\zeta$. The damping factor $\zeta$ is expressed as follows $$\zeta = \frac{1}{2}\sqrt{\frac{N}{\tau K}} = \frac{1}{2T\omega n}$$

where N denotes the dividing number of frequency of the frequency divider, K denotes a loop gain, $\tau$ denotes a time constant of a low pass filter, and $\omega n$ indicates a natural angular frequency. By decreasing the dividing number N of frequency, the lock-up time can be shortened.

As a result, by also forming the oscillator of a high frequency band of millimeter waves and the like in the form of a PLL circuit, various characteristics such as physical processing precision and a temperature characteristic accompanying disturbance can be controlled, so that the high frequency output signal of millimeter waves and the step frequency can be stably set with high precision. Particularly, a multiple CW oscillator for periodically stepping a frequency in short time is realized in a millimeter radar employing a two frequency CW radar system, and the stability of an output signal is increased. Consequently, improvements in various performances of the radar such as detected distance and angular information are realized, and a stable, high-performance, and cheap CW radar can be achieved.

These and objects, feature and advantages of the present invention will become more apparent in view of the following detailed description of the preferred embodiments in conjunction with the accompanying drawings.

DESCRIPTION OF THE PREFERRED EMBODIMENTS

First Embodiment

Figure 1:
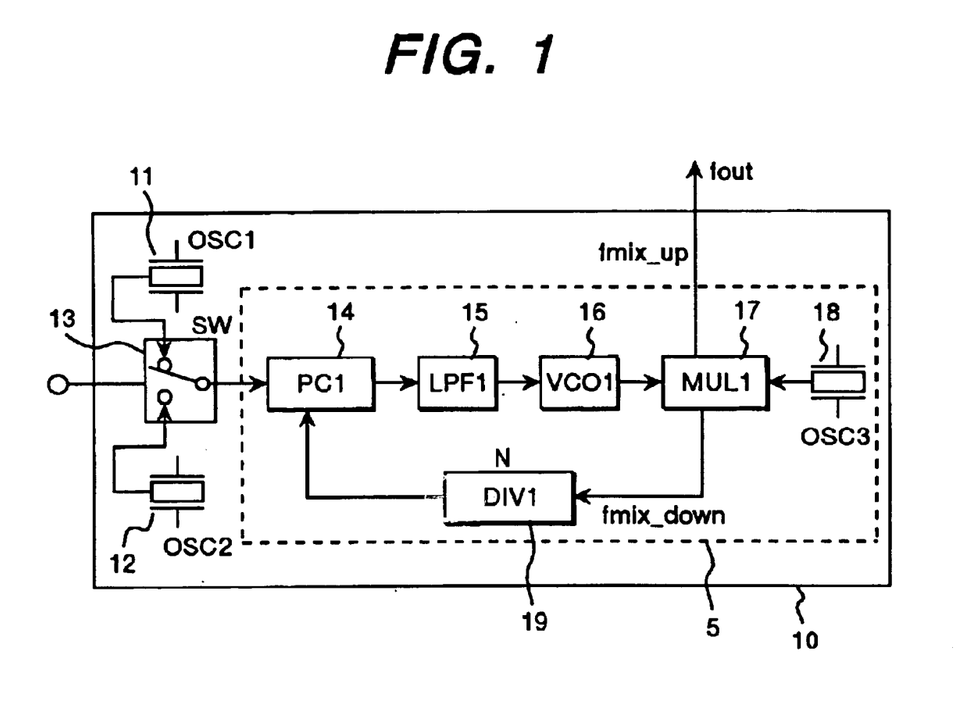
FIG. 1 is a block diagram showing a first embodiment of a multiple PLL oscillator according to the invention.

FIG. 1 is a block diagram showing the configuration of a first embodiment of a multiple PLL oscillator according to the invention.

As shown in FIG. 1, a multiple PLL oscillator 10 has a plurality of reference frequency sources 11 and 12, a switch 13 for periodically selecting one of outputs of the reference frequency sources 11 and 12, and a PLL frequency synthesizer 5 for using the signal selected by the switch 13 as a reference frequency signal.

The frequency synthesizer 5 has: a phase comparator 14 for comparing the phase of the reference frequency source selected by the switch 13 with that of a signal from a feedback loop circuit; a voltage controlled oscillator 16 controlled by a voltage obtained by passing an output of the phase comparator 14 through a low pass filter 15; a mixer 17 for mixing an output of the voltage controlled oscillator 16 and an output of another locked reference frequency oscillator source (oscillator 18) for oscillating a locked frequency; and an output unit for outputting an upper side band frequency fmix_up of the mixer 17 as an output fout. The feedback loop circuit has a frequency divider 19 for dividing the frequency of an input signal of a lower side band frequency fmix_down of the mixer 17 to 1/N.

The reference frequency sources 11 and 12 oscillate at frequencies at least twice as high as a loop band characteristic of the PLL circuit, that is, the low pass filter characteristic, and the frequency difference between the reference frequency sources 11 and 12 is set to be N times of the step frequency of the output fout of the multiple PLL oscillator 10.

To obtain both of mixing-up to a millimeter output signal of a desired frequency and mixing-down to a micro-wave signal which becomes a feedback signal of the PLL loop in the mixer 17, the locked reference frequency source 18 outputs a proper oscillation frequency conformed with desired system specifications to the PLL circuit. The frequency divider 19 is a circuit for dividing the lower side band frequency fmix_down obtained by the mixer 17 so that the lower side band frequency fmix_down becomes equal to the PLL reference frequency. An output of the frequency divider 19 is supplied to the phase comparator 14.

In the embodiment, when the switch 13 selects the reference frequency f1 of the reference frequency source 11 as the reference frequency fr of the PLL oscillator, the difference between an output frequency fvco1 of the voltage controlled oscillator 16 and a frequency f3 of the locked reference frequency source 18 is divided to 1/N by the frequency divider 19, and a feedback control is performed so that the phase of the output of the frequency divider 19 and that of the output (reference frequency fr) of the reference frequency source 11 become the same. That is, the equation (1) is satisfied.

$$fr-(fvco-f3)/N=0, fout=fcvo+f3 f1-(fvco1-f3)/N=0, fout1=fcvo1+f3 \quad (1)$$

When the switch 13 selects the reference frequency f2 of the reference frequency source 12 as the reference frequency fr of the PLL circuit, the frequency difference between the millimeter output signal fout and the output signal (frequency f3) of the reference frequency source 18 is divided by the frequency divider 19 to 1/N, and a feedback control is performed to that the phase of an output of the frequency divider 19 and that of the output (reference frequency fr) of the reference frequency source 12 become the same. That is, the equation (2) is satisfied.

$$f2-(fvco2-f3)/N=0, fout2=fcvo2+f3 \quad (2)$$

From the equations (1) and (2), the frequencies fout1 and fout2 of the millimeter output signals output from the PLL oscillator 10 are expressed by the following equations (3) and (4), respectively.

$$fout1=f1*N+f3*2 \quad (3)$$

$$fout2=f2*N+f3*2 \quad (4)$$

In the conventional PLL circuit, by changing the dividing number N of frequency, the output frequency fout of the PLL circuit 10 is changed. If the loop band is simply increased, the stability of the frequency of the PLL loop deteriorates. Consequently, it is necessary to increase the loop gain K while suppressing the dividing number of frequency to sufficiently compensate the stability of the loop. However, to obtain a feedback signal in a microwave signal band from an output signal in the millimeter wave band by the frequency divider, a few digits are necessary as the dividing number of frequency. In practice, therefore, a sufficient loop gain cannot be obtained.

In the embodiment, as expressed by the equations (3) and (4), by switching the reference frequency fr by the switch 13, the oscillation frequency of the PLL oscillator 10 is changed. Particularly, by changing the reference frequency fr to be compared, the frequency step of an output signal is set to a predetermined value. The step frequency is fs=|fout1−fout2|=|f1−f2|*N which is the frequency relative value of the reference frequency source. Therefore, the loop band of the PLL oscillator 10 depending on the absolute value of the reference frequency fr can be determined irrespective of the step frequency. The loop band of the PLL oscillator 10 can be increased to a faction of the reference frequency, and it is easy to shorten the lock-up time required for the output signal of the multiple PLL oscillator 10 to reach a desired frequency.

In the mixer 17, by mixing up, the millimeter wave signal of a desired frequency is generated and, simultaneously, by mixing down of the feedback signal of the PLL loop from a millimeter to a microwave, the dividing number of frequency of the frequency divider 19 can be decreased, and the loop gain K can be increased. Further, since the frequency step and the frequency divider have no relation, by decreasing and locking the dividing number of frequency, simplification of a logic circuit constructing the frequency divider can be promoted, and the logic delay time required by frequency division can be shortened.

In the embodiment, while maintaining coherency of millimeter wave output signals of the reference frequency sources 11 and 12 and the PLL oscillator 10, the dividing number N of frequency of the frequency divider 19 is decreased, and the loop gain K is increased, thereby enabling the frequency stability of the PLL circuit to be maintained even when the loop band is increased. That is, the lock-up time is shortened.

Second Embodiment

Figure 2:
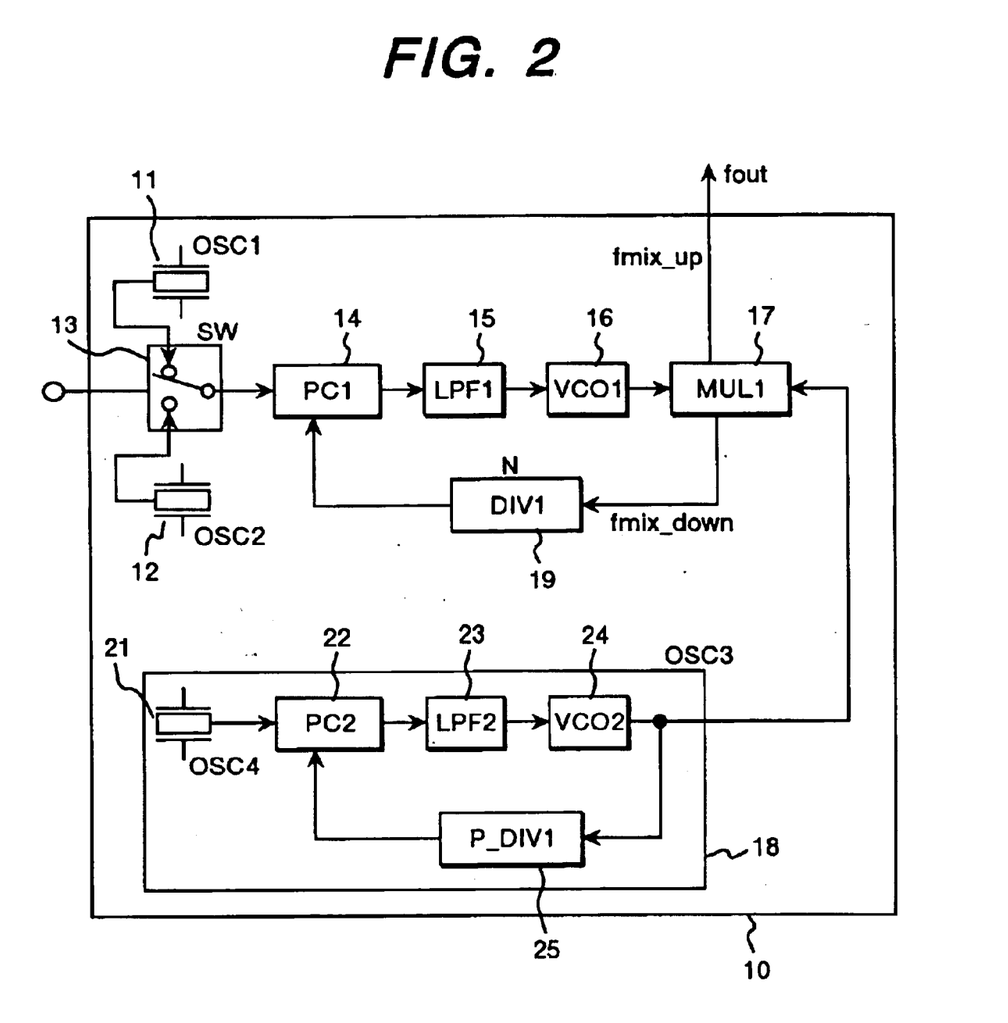
FIG. 2 is a block diagram showing a second embodiment of the multiple PLL oscillator according to the invention.

FIG. 2 is a block diagram showing the configuration of a second embodiment of the multiple PLL oscillator according to the invention. In the multiple PLL oscillator 10 of the embodiment, the locked reference frequency source 18 of the first embodiment is constructed by a reference frequency source 21, a phase comparator 22, a low pass filter 23, a voltage controlled oscillator 24, and a programmable frequency divider 25. The functions and components substantially the same as those in FIG. 1 are designated by the same reference numerals and their detailed description will not be repeated.

The reference frequency source 18 integrates a comparison result of the phase comparator 22 by the low pass filter 23, obtains an output frequency of the voltage controlled oscillator 24 according to the integrated voltage, divides a part of the output frequency as a feedback signal of the PLL loop by the programmable frequency divider 25, compares the phase of the resultant with the phase of a frequency of the reference frequency source (oscillator) 21, and performs the feedback control of the PLL circuit.

Third Embodiment

Figure 3:
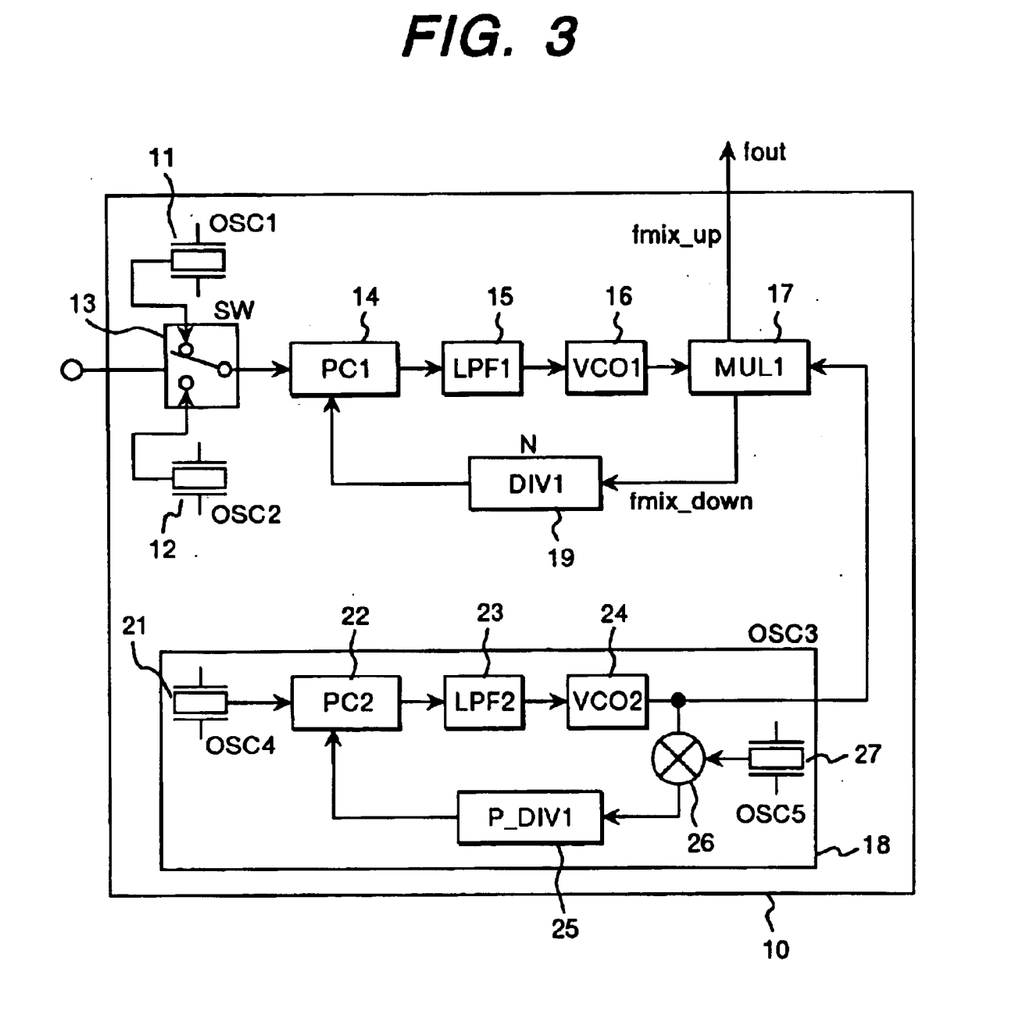
FIG. 3 is a block diagram showing a third embodiment of the multiple PLL oscillator according to the invention.

FIG. 3 is a block diagram showing the configuration of a third embodiment of the multiple PLL oscillator according to the invention. In the multiple PLL oscillator 10 of the embodiment, an output of the voltage controlled oscillator 24 in the reference frequency source 18 of the PLL oscillator of the second embodiment is mixed with an output of a reference frequency source 27 by a mixer 26, and a part of the resultant is added to the programmable frequency divider 25. Functions and components substantially the same as those of FIG. 2 are designated by the same reference numerals and their detailed description will not be repeated. In the third embodiment, stability and setting of the frequency of the reference frequency source 18 can be easily achieved.

Fourth Embodiment

Figure 4:
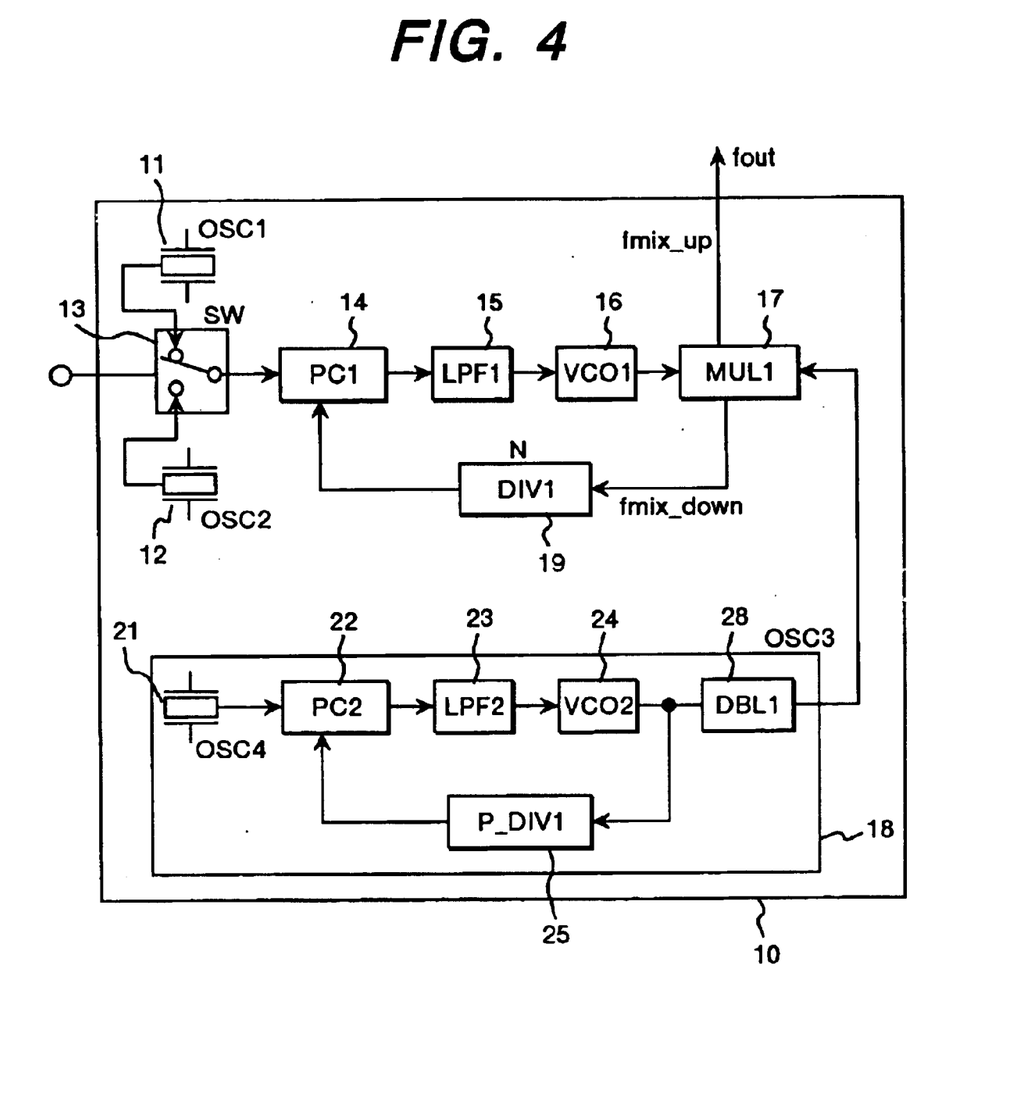
FIG. 4 is a block diagram showing a fourth embodiment of the multiple PLL oscillator according to the invention.

FIG. 4 is a block diagram showing the configuration of a fourth embodiment of the multiple PLL oscillator according to the invention. The multiple PLL oscillator 10 of the embodiment is functionally the same as that of the embodiment shown in FIG. 2 except that a frequency multiplier 28 for multiplying the frequency of an output of the voltage controlled oscillator 24 to obtain the desired oscillation frequency f3 input to the mixer 17 is mounted. The configurations, functions, and components substantially the same as those in FIG. 2 are designated by the same reference numerals as those of FIG. 1 and their detailed description will not be repeated. In the fourth embodiment, the oscillation of the oscillator 21 can be set to be low, so that the frequency of the locked reference frequency source 18 can be stabilized.

Fifth Embodiment

Figure 5:
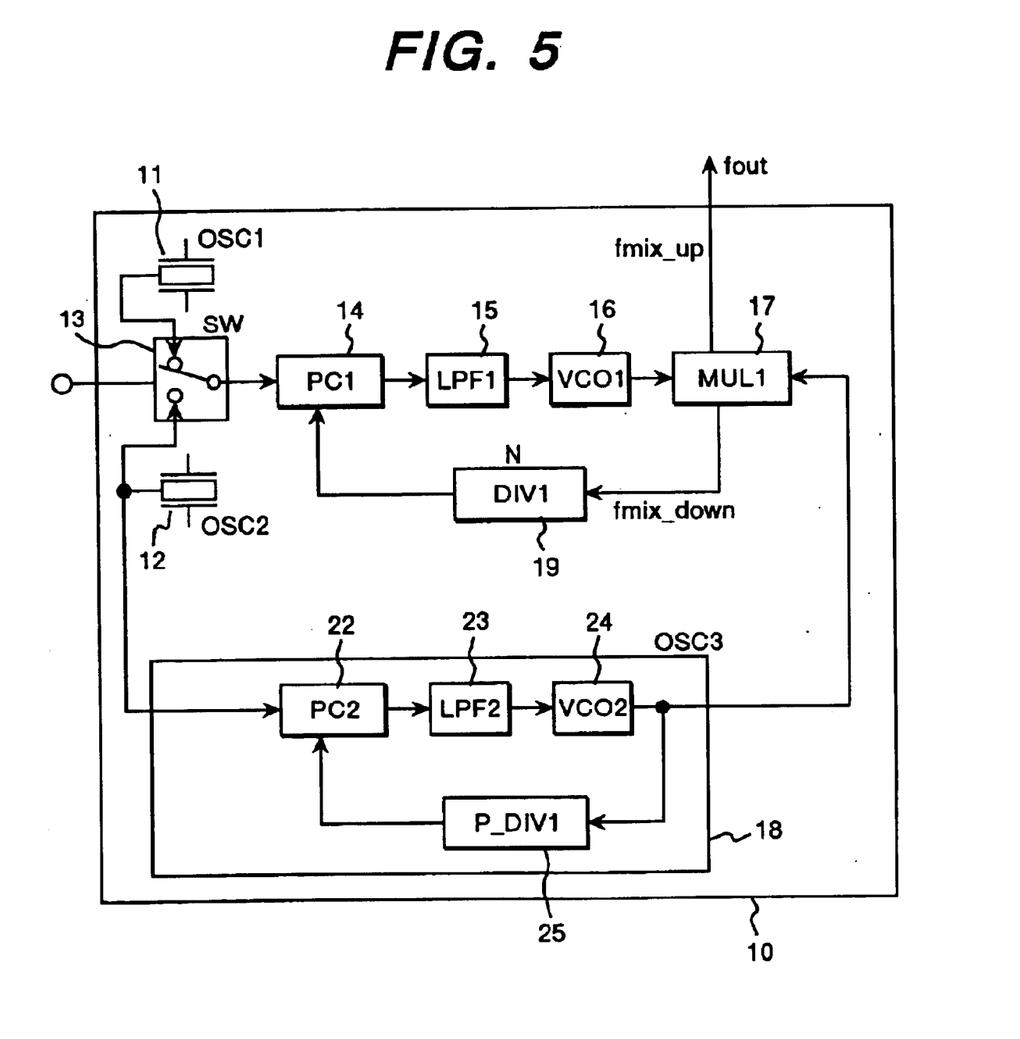
FIG. 5 is a block diagram showing a fifth embodiment of the multiple PLL oscillator according to the invention.

FIG. 5 is a block diagram showing the configuration of a fifth embodiment of the multiple PLL oscillator according to the invention. The multiple PLL oscillator 10 of the embodiment is functionally the same as those in the third embodiment except that, to assure coherency of frequency of the millimeter output signal and the reference frequency source 18 in the PLL oscillating circuit 10, as the reference frequency fr used for the PLL circuit in the reference frequency source 18, the reference frequency of one of the plurality of reference frequency sources 11 and 12 is used. Functions and components substantially the same as those of FIG. 3 are designated by the same reference numerals as those of FIG. 3 and their detailed description will not be repeated. According to the fifth embodiment, the number of oscillators constructing the multiple PLL oscillator can be reduced.

Sixth Embodiment

Figure 6:
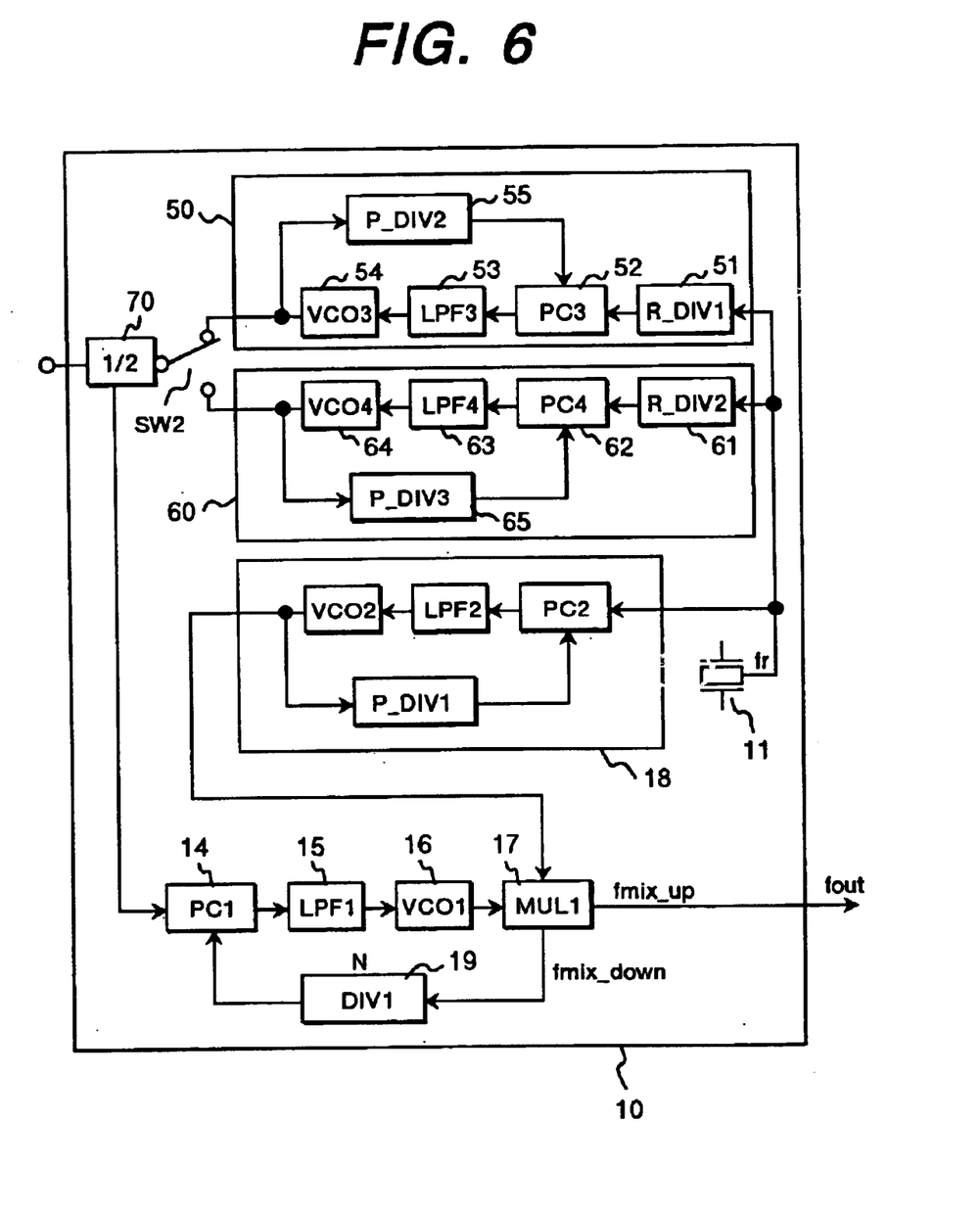
FIG. 6 is a block diagram showing a sixth embodiment of the multiple PLL oscillator according to the invention.

FIG. 6 is a block diagram showing the configuration of a sixth embodiment of the multiple PLL oscillator according to the invention. In the embodiment, two reference frequency sources whose frequencies are selectively supplied to the phase comparator 14 of the fifth embodiment are constructed by the reference frequency source 11, PLL circuits 50 and 60, and a ½ frequency divider 70 with a switch for selecting an output of one of the PLL circuits 50 and 60.

Each of the PLL circuits 50 and 60 is a PLL circuit for obtaining a single frequency from the reference frequency source 11. The PLL circuits 50 and 60 include reference dividers 51 and 61, phase comparators 52 and 62, low pass filters 53 and 63, voltage controlled oscillators 54 and 64, and frequency dividers 55 and 65, respectively. The PLL circuit 50 uses the reference frequency source 11 for the reference frequency fr, and a frequency of ¹⁄₁₀₀ is generated by the reference divider 51 from an output of the common oscillator 11. If the frequency of the oscillator 11 is 12 MHz, the reference divider 51 generates the frequency of 120 kHz. The reference frequency of 120 kHz and a result of frequency division of the frequency divider 55 are input to the phase comparator 52. The comparison result is integrated by the low pass filter 53, and the resultant of integration is input to a frequency control terminal of the voltage controlled oscillator 54. A part of an oscillation frequency of the voltage controlled oscillator 54 is divided by the dividing number of frequency set by the frequency divider 55, and the resultant is fed back to the phase comparator 52. When the dividing number of frequency set in the frequency divider 55 is 1000, the oscillation frequency f1 obtained from the PLL circuit 50 is 120.12 MHz.

The PLL circuit 60 uses the oscillator 11 for the reference frequency fr, and generates a frequency of ¹⁄₁₀₀ by the reference divider 61 from the output of the oscillator 11. If the frequency of the reference frequency oscillator 11 is 12 MHz, the reference divider 61 generates the frequency of 120 kHz. The reference frequency of 120 kHz and the result of frequency division of the frequency divider 65 are input to the phase comparator 62. A result of comparison is integrated by the low pass filter 63, and the result is input to a frequency control terminal of the voltage control oscillator 64. A part of the oscillation frequency of the voltage controlled oscillator 64 is divided by the dividing number of frequency set by the frequency divider 65, and the result is fed back to the phase comparator 62. When the dividing number of frequency set in the frequency divider 65 is 1001, the oscillation frequency f2 obtained from the PLL circuit 60 is 120.12 MHz.

The ½ frequency divider 70 with a switch receives two frequencies of 120 MHz and 120.12 MHz obtained from the PLL circuits 50 and 60, selectively supplies the frequencies to the ½ frequency divider 70, and supplies 60 MHz or 60.06 MHz as the reference frequency fr of the multiple PLL circuit 10 to the PLL loop. The phase comparator 14 compares the phase of the reference frequency with that of an output signal of the frequency divider 19 as a feedback signal of the PLL loop, and outputs the result to the low pass filter 15.

When the low pass filter 15 sets 6 MHz in accordance with lock-up time target of 0.15 μsec of the multiple PLL oscillator 10, the phase comparison result is integrated, and the resultant value is output to the frequency control terminal of the voltage control oscillator 16. The voltage control oscillator 16 oscillates at a frequency according to an output voltage integrated by the low pass filter (LPF). When the reference frequency is 60 MHz, the oscillation frequency is 38.4 GHz. When the reference frequency is 60.06 MHz, the oscillation frequency is 38.4003 GHz. The mixer 17 uses both sides frequency bands of the mixer to obtain a millimeter wave band output as an output signal of the PLL circuit and an output equal to or lower than the micro wave band as a feedback signal of the PLL loop.

The upper side band as a sum of the frequency of the voltage controlled oscillator 16 and the frequency of the third reference frequency source 18 is used as millimeter wave outputs of 76.5 GHz and 76.5003 GHz, and the lower side band as a frequency difference is 300 MHz and 300.3 MHz obtained as micro-wave signals which can be processed by a cheap frequency divider. To obtain both of mixing-up to a millimeter output signal of a desired frequency and mixing-down to a micro-wave signal which becomes a feedback signal of the PLL loop in the mixer 17, the reference frequency source 18 outputs a proper oscillation frequency conformed with desired system specifications to the PLL circuit, so that the reference frequency of the reference frequency source 18 is 38.1 GHz. The frequency divider 19 is a circuit for dividing the lower side band frequency obtained by the mixer 17 so as to be equal to the PLL reference frequency. The dividing number of frequency is 5, and results of frequency division of 60 MHz and 60.06 MHz are supplied as signals to be compared to the phase comparator 14.

The reference frequency source 18 is the same PLL circuit as that of the reference frequency source 18 of FIG. 5.

In the embodiment, all of the reference frequency sources 11, 12, and 18 in FIG. 1 are constructed by PLL circuits and the same reference frequency output from the reference frequency source 11 is used as all of the reference frequencies used for the reference frequency sources 11, 12, and 13. Consequently, the multiple PLL circuit 10 becomes the PLL circuit having coherency and the frequencies f1 and f2 of the two reference frequency sources can be freely controlled by set value of the dividing numbers of frequency of the reference dividers 51 and 61 and the frequency dividers 55 and 65. Since the dividing number of frequency of the programmable frequency divider 25 of the reference frequency source 18 can be set, the millimeter oscillation frequency and the step frequency can be controlled by a program.

Seventh Embodiment

Figure 7:
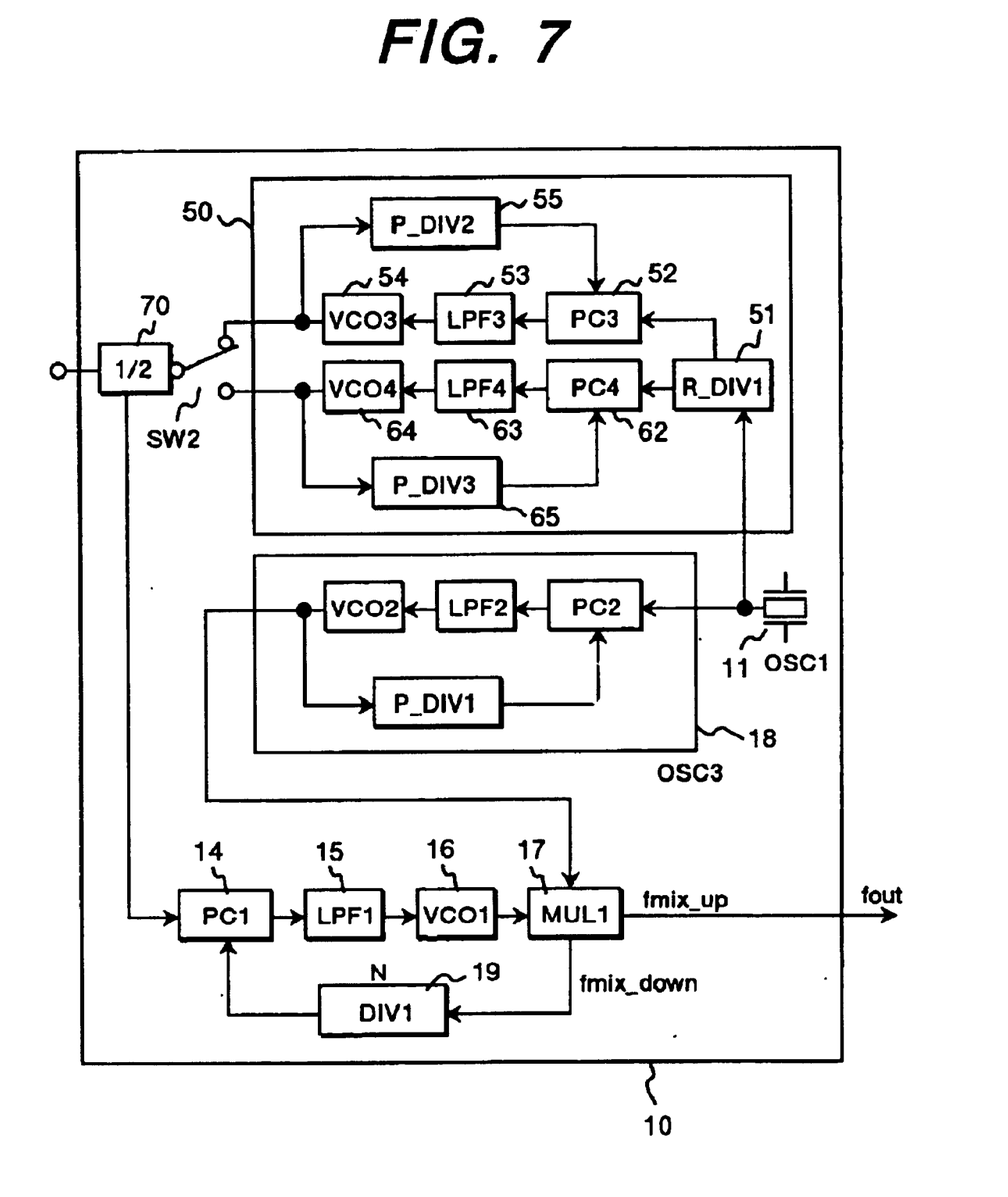
FIG. 7 is a block diagram showing a seventh embodiment of the multiple PLL oscillator according to the invention.

FIG. 7 shows a seventh embodiment of the multiple PLL oscillator according to the invention. The multiple PLL oscillator of the seventh embodiment is substantially the same as that of the sixth embodiment except that one reference divider 51 is provided instead of the reference dividers 51 and 61. In the seventh embodiment as well, all of the plurality of reference frequency sources 11, 12, and 18 in FIG. 1 are constructed by PLL circuits and the same reference frequency output from the oscillator 11 is used as all of the reference frequencies used for the reference frequency sources 11, 12, and 13. Consequently, the multiple PLL circuit 10 becomes the PLL circuit having coherency and the frequencies f1 and f2 of the two reference frequency sources can be freely controlled by a set value of the dividing numbers of frequency of the reference dividers 51 and 61 and the frequency dividers 55 and 65. Since the dividing number of frequency of the programmable frequency divider 25 of the third reference frequency source 18 can be set, the millimeter oscillation frequency and the step frequency can be controlled by a program.

Eighth Embodiment

Figure 8:
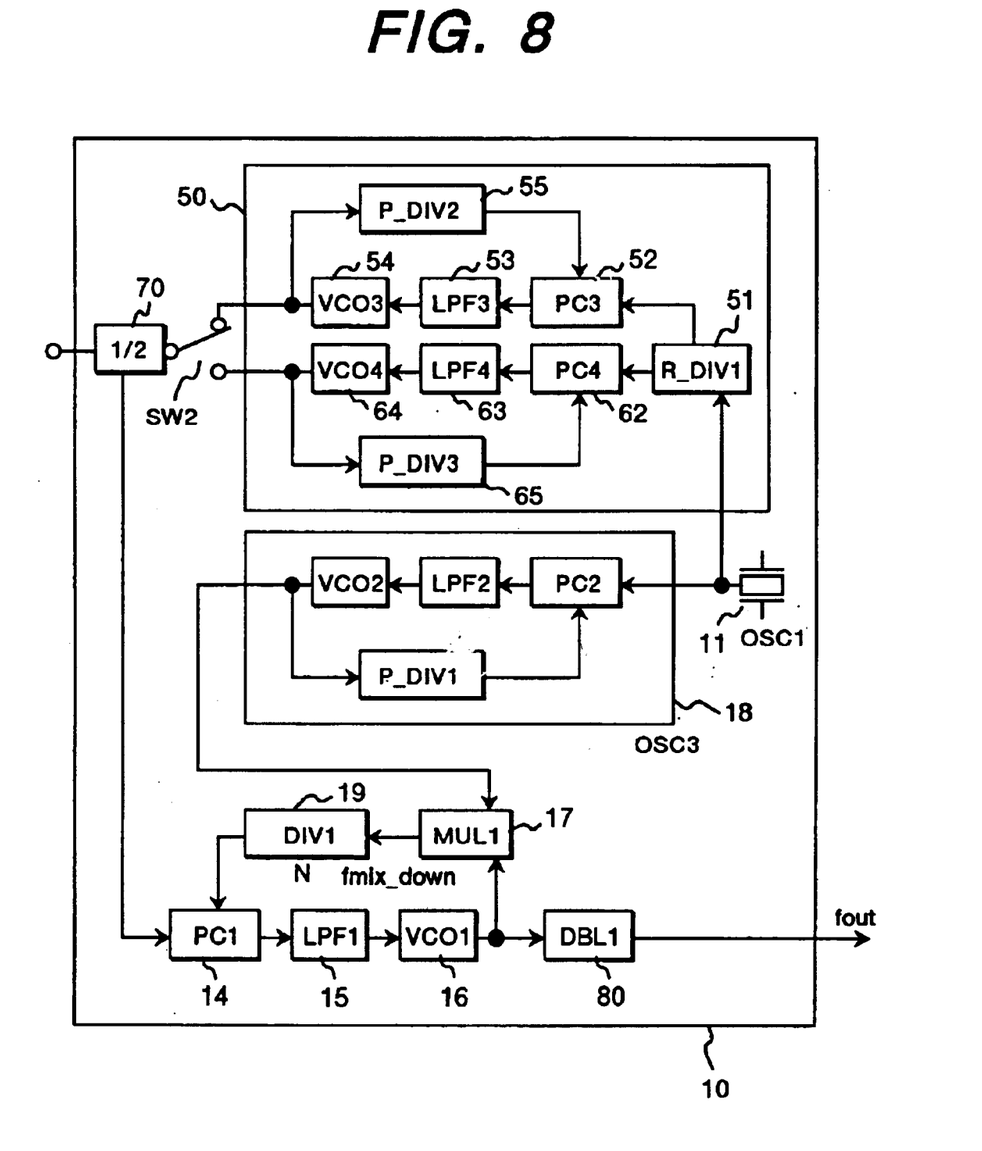
FIG. 8 is a block diagram showing an eighth embodiment of the multiple PLL oscillator according to the invention.

FIG. 8 shows an eighth embodiment of the multiple PLL oscillator according to the invention. The multiple PLL oscillator of the eighth embodiment is constructed so that as the output fout of the multiple PLL oscillator of the seventh embodiment, an output of the voltage controlled oscillator 16 is taken via a to multiplier 80. The other components substantially the same as those of FIG. 7 are designated by the same reference numerals and their description will not be repeated.

The PLL circuit 50 uses a frequency of the reference frequency source 11 as the reference frequency fr, and generates a frequency of ¹⁄₁₀₀ from an output of the reference frequency source 11 by the reference divider 51. If the frequency of the reference frequency source 11 is 10 MHz, the reference divider 51 generates a frequency of 100 kHz. The reference frequency of 100 kHz and the result of frequency division of the frequency divider 55 are supplied to the phase comparator 52. The result of comparison is integrated by the low pass filter 53, and the resultant is input to the frequency control terminal of the voltage controlled oscillator 54. A part of the oscillation frequency of the voltage controlled oscillator 54 is divided by the dividing number of frequency set by the frequency divider 55, and the result is fed back to the phase comparator 52. When the dividing number of frequency set in the frequency divider 55 is 1200, the oscillation frequency f1 obtained from the voltage controlled oscillator 54 is 120 MHz.

The reference frequency of 100 kHz obtained from the reference divider 51 and the result of frequency division of the frequency divider 65 are input to the phase comparator 62, the comparison result is integrated by the low pass filter 63, and the resultant is input to the frequency control terminal of the voltage controlled oscillator 64. A part of the oscillation frequency of the voltage control oscillator 64 is divided by the dividing number of frequency set by the frequency divider 65, and the resultant is fed back to the phase comparator 62. When the dividing number of frequency set in the frequency divider 65 is 1201, the oscillation frequency f2 obtained from the voltage control oscillator 64 is 120.1 MHz, and the PLL circuit 50 generates both oscillation frequencies of 120 MHz and 120.1 MHz.

The ½ frequency divider with a switch receives two frequencies of 120 MHz and 120.1 MHz obtained from the PLL circuit 50, selectively supplies the frequencies to the ½ frequency divider, and supplies 60 MHz or 60.05 MHz as the reference frequency fr of the multiple PLL circuit 10 to the PLL loop. The phase comparator 14 compares the phase of the reference frequency with that of an output signal of the frequency divider 19 as a feedback signal of the PLL loop, and outputs the result to the low pass filter 15. When the low pass filter 15 sets 5 MHz in accordance with lock-up time target of 0.15 μsec of the multiple PLL oscillator, the phase comparison result is integrated, and the result is output to the frequency control terminal of the voltage control oscillator 16. The voltage control oscillator 16 oscillates at a frequency according to an output voltage integrated by the low pass filter 15. When the reference frequency is 60 MHz, the oscillation frequency is 38.3 GHz. When the reference frequency is 60.05 MHz, the oscillation frequency is 38.30015 GHz. The mixer 17 uses the lower side frequency band of the mixer to obtain an output which is equal to or lower than a micro-wave band as a feedback signal of the PLL loop and, consequently, 180 MHz and 180.15 MHz are obtained as micro-wave band outputs which can be processed by a cheap frequency divider. Since the reference frequency source 18 outputs a proper oscillation frequency conformed with desired system specifications to the PLL circuit to obtain the micro-wave band signal which becomes a feedback signal of the PLL loop in the mixer 17, the reference frequency of the reference frequency source 18 is 38.12 GHz. The frequency divider 19 is a circuit for dividing the lower side band frequency obtained by the mixer 17 so as to be equal to the PLL reference frequency. The dividing number N of frequency is 3, and results of frequency division of 60 MHz and 60.05 MHz are input as signals to be compared to the phase comparator 14.

The reference frequency source 18 is a fourth PLL circuit which integrates the result of the phase comparator 22 by the low pass filter 23, obtains an output frequency of the voltage controlled oscillator 24 according to the integrated voltage, divides a part of the output frequency as the feedback signal of the PLL loop by the programmable frequency divider 25, performs phase comparison with the reference frequency source 11, and performs a feedback control of the PLL. Finally, the multiplier 80 doubles the output frequency of the voltage controlled oscillator 16 to 76.6 GHz.

In the embodiment as well, all of the reference frequency sources 11, 12, and 18 of the PLL oscillator in FIG. 1 are constructed by PLL circuits and the same reference frequency output from the reference frequency source 11 is used as all of the reference frequencies used for the reference frequency sources 11, 12, and 13. Consequently, the multiple PLL circuit 10 becomes the PLL circuit having coherency and the frequencies f1 and f2 of the two reference frequency sources can be freely controlled by a set value of the dividing numbers of the reference dividers 51 and 61 and the frequency dividers 55 and 65. Since the dividing number of frequency of the programmable frequency divider 25 of the reference frequency source 18 can be set, the millimeter oscillation frequency and the step frequency can be controlled by a program.

Ninth Embodiment

Figure 9:
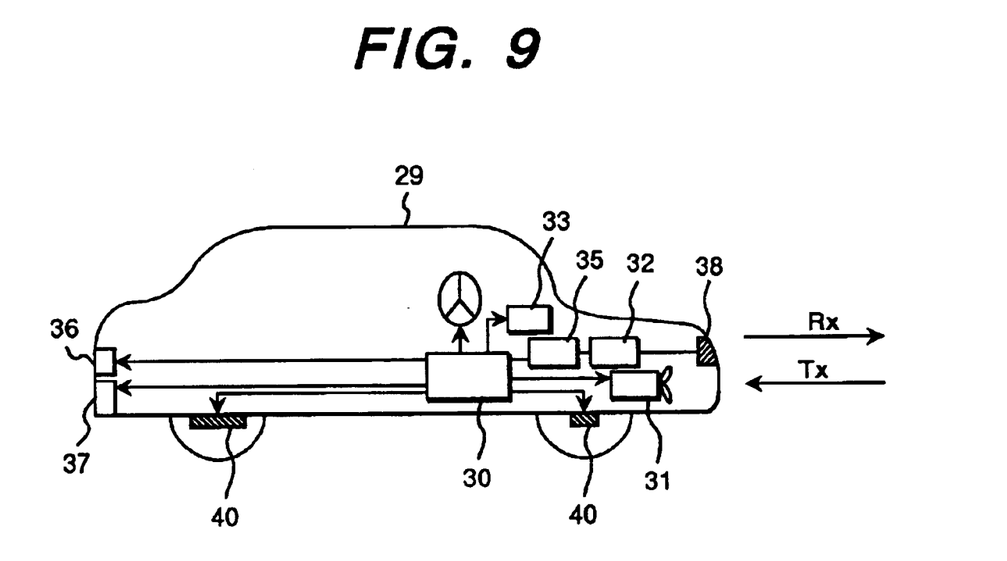
FIG. 9 is a diagram showing the configuration of an embodiment of mounting a millimeter wave radar according to the invention on a vehicle.

FIG. 9 is a diagram showing an embodiment of a vehicle on which a two frequency CW radar using millimeter waves of the invention is mounted. A radar module 38 having a two frequency PLL oscillator using millimeter waves according to the invention is provided in the front part (and also for the rear part as necessary) of a vehicle 29. The radar module 38 is connected to a central processing unit (CPU) 35 such as a micro-processor via a data processing circuit 32. The CPU 35 obtains positional information or speed information of an object to be detected on the basis of a signal derived by the radar module 38, and adds the information to an active cruise controller (ACC) 30. The active cruise controller 30 controls, as necessary, an engine 31, an accelerator lamp 36, a turn signal lamp 37, a brake 40, and the like on the basis of the positional or speed information, and displays necessary information on a display 33.

Figure 10:
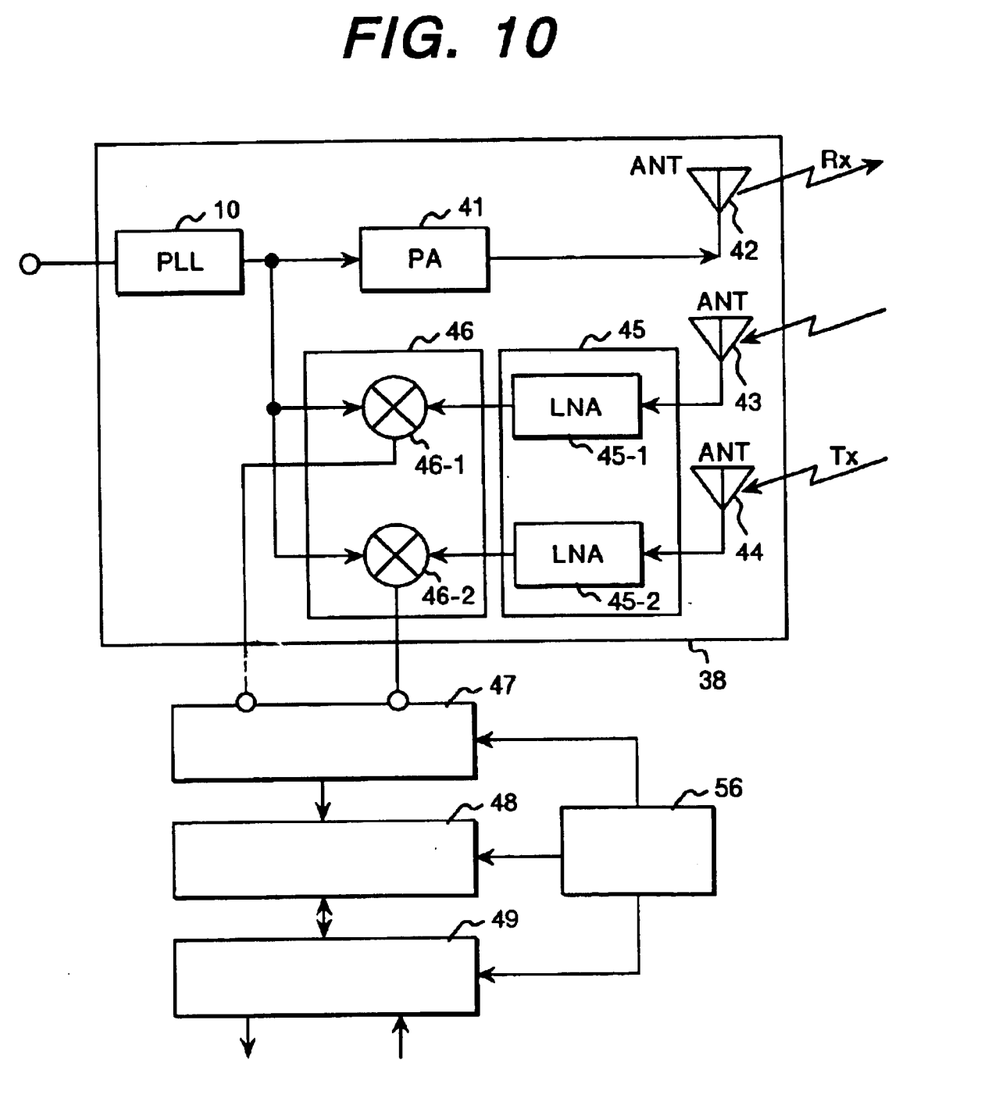
FIG. 10 is a block diagram showing the principle configuration of a PLL oscillator.

FIG. 10 is a block diagram showing the configuration of a first example of the radar module 38 and the data processing circuit 32 of the two frequency CW radar mounted on the vehicle. The radar module 38 has: a two frequency PLL oscillator 10 according to the invention; a power amplifier 41 for amplifying a millimeter wave signal generated by the two frequency PLL oscillator 10; a transmitting antenna 42 for radiating an amplified millimeter wave signal to a space; two receiving antennas 43 and 44 for receiving a signal Tx which is a reflection signal from the subject such as another vehicle, of a transmission signal Rx radiated into the space; low noise amplifiers 45-1 and 45-2 for amplifying millimeter wave signals obtained from the receiving antennas 43 and 44; and mixers 46-1 and 46-2 for mixing the millimeter wave signal generated by the two frequency PLL oscillator 10 and outputs of the amplifiers 45-1 and 45-2. A Doppler signal component is extracted from the mixer 46.

The Doppler signal is converted into a digital signal by an A/D converter 47, and the digital signal is supplied to a digital signal processing circuit 48. Synchronization is detected by using switching periods of transmission frequencies f1 and f2, and converted into distance information and speed information of the subject. The embodiment relates to diplexer-type Doppler for switching and transmitting two frequencies at high speed. Distance information R and relative speed information V are obtained by the following equations.

$$R = C \cdot \Delta\phi / (4\pi\Delta f)$$

$$V = C/2 \cdot fd1/f1 \text{ or } C/2 \cdot fd2/f2$$

where C denotes a propagation speed of an electric wave, Δf denotes a transmission frequency difference (step frequency=f1−f2 ), Δφ indicates a phase difference of Doppler waves, f1 and f2 denote transmission frequencies, and fd1 and fd2 denote Doppler frequencies. The direction of the subject is obtained from the value of sum or difference of outputs of the two mixers 46-1 and 46-2.

The digital signal processing circuit 48 transmits/receives signals to/from the active cruise controller 30 in FIG. 9 via an interface circuit 49. A power is supplied from a power source 56 to the A/D converter 47, signal processing circuit 48, and interface circuit 49.

Specific numerical values in the embodiment will be described hereinbelow as an example. An output frequency fout of the radar module 38 is 76.5 GHz, a step frequency of the output frequency is 300 kHz, and desired lock-up time is 0.15 μs. The output frequency fr1 of the reference frequency source 1 and the output frequency fr2 of the reference frequency source 2 are set to values different from each other only by the step frequency or a frequency fp (for example, 60 kHz) obtained by dividing the step frequency by the dividing number N (=5) of frequency of the frequency divider. From the inverse of the desired lock-up time 0.15 μs, a natural angular frequency ωn of the PLL loop is set, and the frequencies fr1, fr2, and fp are set to the frequency of 60 MHz at lest twice as high as the natural angular frequency ωn.

When the dividing number N of frequency of the frequency divider is set to 5 and the output frequency fr1 of the reference frequency source 1 is set to 60 MHz, the output frequency fr2 of the reference frequency source 2 naturally becomes 60.06 MHz.

To obtain 76.5 GHz as the output frequency fout of the two frequency PLL oscillator and 60 MHz as the signal fp to be compared of the PLL loop, when the frequency of the voltage controlled oscillator is set to fvco and the frequency of the locked oscillator is fmix, the upper and lower side band frequencies fmix_up and fmix_down as outputs of the mixer have the relations expressed by the following equations (5) and (6).

$$fmix\_up = fvco + fmix \quad (5)$$

$$fmix\_down = fvco - fmix \quad (6)$$

Therefore, when fout=fmix_up=76.5 GHz and fmix_down=300 MHz, $$fvco = (fmix\_up + fmix\_down)/2 \quad (7)$$

$$fvco = (76.5 \text{ GHz} + 0.3 \text{ GHz})/2 = 38.4 \text{ GHz}$$

$$fmix = (fmix\_up - fmix\_down)/2 \quad (8)$$

$$fmix = (76.5 \text{ GHz} - 0.3 \text{ GHz})/2 = 38.1 \text{ GHz}$$

When fout=fmix_up=76.5003 GHz, and fmix_down=300.3 MHz, $$fvco' = (76.5003 \text{ GHz} + 0.3003 \text{ GHz}) = 38.4003 \text{ GHz}$$

$$fmix' = (76.5003 \text{ GHz} - 0.3003 \text{ GHz}) = 38.1 \text{ GHz}$$

The frequency of the voltage controlled oscillator 16 is set to 38.4 GHz or 38.4003 GHz, and the frequency of the locked oscillator 18 is set to 38.1 GHz. The frequency divider 19 divides the lower side band frequency fmix_down as the frequency difference signal by 5, thereby generating a frequency of 60 MHz or 60.06 MHz which is looped back as a phase comparison signal fp to the phase comparator 4.

As described above, the two frequency CW radar oscillator with the lock-up time to reach the desired frequency reduced to 0.15 μs or shorter while maintaining the loop band of 6 MHz and capable of setting the step frequency to 300 kHz is used.

The two frequency CW radar using millimeter waves is effective as an obstacle watching device which is mounted on the vehicle 29 and watches a vehicle, a human being, or the like which is a moving body or still body. When a millimeter radar is used as an obstacle watching device with an improved system S/N ratio for a moving body or still body 300, the radar functions to a high degree as a sensor detecting distance and/or direction of automatic driving control which can drive while detouring an obstacle. The radar can be also used as a sensor detecting distance and/or angle in the case of an automatic control type which stops in a predetermined position in a target place by maximally using a minimum detectable distance resolution as the characteristic of the two frequency CW radar.

As described above, according to the invention, the multiple PLL oscillator capable of obtaining an output frequency in a millimeter wave band with a step frequency of about 300 kHz which repeats a frequency step in short time uses the frequency difference between the reference frequency sources by realizing the frequency step by a switch of the reference frequency irrespective of frequency divider, uses the signals indicative of the frequency sum and difference obtained by the mixer as an output signal of the multiple PLL circuit and the loop feedback signal of the PLL loop, respectively, and decreases the dividing number of frequency of the frequency divider, thereby achieving widening of the loop band and increase in the loop gain. Improvements in stability of the PLL circuit and reduction in the lock-up time can be realized.

Table 1 shows effects of reduction in the dividing number of frequency of the frequency divider, widening of the loop band, increase in the loop gain, and reduction in the lock-up time in the embodiment of the invention and the oscillator shown in FIG. 12.

TABLE 1

|  | embodiment of the invention | oscillator of FIG. 12 |
|---|---|---|
| oscillation frequency | 76 GHz | 76 GHz |
| VCO | 38 GHz | 38 GHz |
| OSC | 38 GHz | 38 GHz |
| mixer | 38 GHz | 38 GHz |
| frequency after mixing down | 300 MHz | 300 MHz |
| frequency step | 300 kHz | 300 kHz |
| reference frequency | 60 MHz | 120 kHz |
| PLL loop band | 6 MHz | 12 kHz |
| lock-up time | ∝0.15 μs | ∝30 μs |
| the dividing number | 1/5 | 1/2500 |

As described above, the multiple PLL oscillator of the invention can control various characteristics such as physical processing precision and a temperature characteristic accompanying a disturbance by forming the oscillator in the high frequency band in millimeter wave as a PLL circuit, and a millimeter high-frequency output signal frequency and the step frequency can be set very stably. Particularly, in a millimeter wave radar using a two frequency CW radar system, by realizing the PLL circuit as the multiple CW oscillator for periodically stepping the frequency in short time and increasing stability of an output signal, improvements in various performances of the radar such as detection distance and angle information are expected, and a very stable, high-performance, and cheap radar device can be realized.

While the present invention has been described above in conjunction with the preferred embodiments, one of skill in the art would be enabled by this disclosure to make various modifications to this embodiments and still be within the scope and spirit of the invention as defined in the appended claims.

What is claimed is:

1. A multiple millimeter CW radar comprising:
   a multiple PLL oscillator;
   a transmitting antenna radiating a millimeter wave signal of an oscillation output of said multiple PLL oscillator into the space;
   a receiving antenna receiving a signal reflected by a subject, of said radiated millimeter wave signal;
   a mixer for mixing the millimeter wave signal obtained from said receiving antenna with an output of said multiple PLL oscillator; and
   a signal processing circuit processing an output of said mixer and detecting position information and/or speed information of said subject,
   said multiple PLL oscillator being an oscillator for oscillating and outputting a plurality of frequencies having a predetermined step frequency, comprising:
      a first and a second reference frequency sources;
      a switch for selecting one of outputs of said first and second reference frequency sources alternatively and at predetermined time interval; and
      a PLL frequency synthesizer generating a millimeter wave oscillation output corresponding to each of said first and second reference frequency sources,
      wherein said PLL frequency synthesizer comprises:
         a phase comparator for comparing a phase of output signal of a frequency divider with a phase of a signal of the reference frequency source selected by said switch;
         a low pass filter smoothing the output of the phase comparator;
         a voltage controlled oscillator controlled by an output of said low pass filter;

a mixer for mixing an output of said voltage controlled oscillator with an output of a locked reference frequency source;

an output unit for outputting an upper side band frequency signal of said mixer as an output of the multiple PLL oscillator; and a feedback unit for inputting an output of a lower side band frequency signal of said mixer to said frequency divider; and the frequency difference of said first and second reference frequency sources is equal to a frequency obtained by dividing a frequency of the lower side band frequency signal of said mixer by the dividing number of said frequency divider.

2. A vehicle on which a multiple millimeter CW radar and an active cruise controller for controlling driving of the vehicle by using information detected by the multiple millimeter CW radar are mounted, wherein said multiple millimeter CW radar comprises:
a multiple PLL oscillator;
a transmitting antenna radiating a millimeter wave signal of an oscillation output of said multiple PLL oscillator into the space;
a receiving antenna receiving a signal reflected by a subject, of said radiated millimeter wave signal;
a mixer for mixing the millimeter wave signal obtained from said receiving antenna with an output of said multiple PLL oscillator; and
a signal processing circuit processing an output of said mixer and detecting position information and/or speed information of said subject, and
said multiple PLL oscillator being an oscillator for oscillating and outputting a plurality of frequencies having a predetermined step frequency, comprising:
first and second reference frequency sources;
a switch for selecting one of outputs of said first and second reference frequency sources alternatively and at predetermined time interval; and
a PLL frequency synthesizer generating a millimeter wave oscillation output corresponding to each of said first and second reference frequency sources,
wherein said PLL frequency synthesizer comprises:
a phase comparator for comparing a phase of output signal of a frequency divider with a phase of a signal of the reference frequency source selected by said switch;
a low pass filter smoothing the output of the phase comparator;
a voltage controlled oscillator controlled by an output of said low pass filter;
a mixer for mixing an output of said voltage controlled oscillator with an output of a locked reference frequency source;
an output unit for outputting an upper side band frequency signal of said mixer as an output of the multiple PLL oscillator; and
a feedback unit for inputting an output of a lower side band frequency signal of said mixer to said frequency divider; and
the frequency difference of said first and second reference frequency sources is equal to a frequency obtained by dividing frequency of the lower side band frequency signal of said mixer by the dividing number of said frequency divider.

3. A multiple PLL oscillator for oscillating and outputting a plurality of frequencies having a predetermined step frequency, comprising:
a first and a second reference frequency sources;
a switch for selecting the ore of outputs of said first and said second reference frequency sources alternatively and at predetermined time interval; and
a PLL frequency synthesizer generating a millimeter wave oscillation output corresponding to each of said first and second reference frequency sources,
wherein said PLL frequency synthesizer comprises:
a phase comparator for comparing a phase of output signal of a frequency divider with a phase of a signal of the reference frequency source selected by said switch;
a low pass filter smoothing the output of the phrase comparator;
a voltage controlled oscillator controlled by an output of said low pass filter;
a mixer for mixing an output of said voltage controlled oscillator with an output of a locked reference frequency source;
an output unit for outputting an upper side band frequency signal of said mixer as an output of the multiple PLL oscillator; and
a feedback unit for inputting an output of a lower side band frequency signal of said mixer to said frequency divider, and
the frequency difference of said first and second reference frequency sources is equal to a frequency obtained by dividing frequency of the lower side band frequency signal of said mixer by the dividing number (N) of said frequency divider.

4. The multiple PLL oscillator according to claim 3, wherein at least one of said first and second reference frequency sources and the locked reference frequency source is an oscillator having a PLL circuit.

5. The multiple PLL oscillator according to claim 3, wherein said locked reference frequency source comprises:
a first oscillator;
a first frequency divider for dividing an output of a first voltage controlled oscillator and for adding output thereof to said mixer;
a first phase comparator for comparing the phase of an output of said first frequency divider and the phase of an output of said first oscillator; and
a low pass filter for integrating outputs of said first phase comparator and for controlling the first voltage controlled oscillator.

6. The multiple PLL oscillator according to claim 5, wherein a first mixer for mixing an output of said first voltage controlled oscillator and an output of a second oscillator is provided between said first voltage controlled oscillator and said first frequency divider.

7. The multiple PLL oscillator according to claim 5, wherein a multiplier for multiplying a frequency of an output of said first voltage controlled oscillator is provided between said first voltage controlled oscillator and said mixer.

8. The multiple PLL oscillator according to claim 3, wherein each of said first and second reference frequency sources comprises:
a first oscillator; and
an oscillating circuit having a reference divider for dividing an output of said first oscillator and a plurality of PLL circuits using a plurality of signals obtained by dividing the output by said reference divider as reference frequencies, and
said reference frequency source takes the form of an oscillation circuit having a PLL circuit using the frequency of an output of said first oscillator as a reference frequency.

* * * * *